United States Patent [19]
Ho et al.

[11] Patent Number: 6,051,475
[45] Date of Patent: Apr. 18, 2000

[54] METHOD FOR MANUFACTURING A SILICIDE TO SILICIDE CAPACITOR

[75] Inventors: Yen-Shih Ho, Chai-Yi; Chun-Hon Chen, Hsin Chu, both of Taiwan

[73] Assignee: Taiwan Semiconductor Manufacturing Company, Hsin-Chu, Taiwan

[21] Appl. No.: 09/089,558

[22] Filed: Jun. 3, 1998

[51] Int. Cl.[7] .................................................. H01L 21/28
[52] U.S. Cl. .......................... 438/396; 438/253; 438/795
[58] Field of Search ................................. 438/253, 396, 438/593, 795, FOR 193, FOR 207, FOR 220, FOR 334, FOR 430

[56] References Cited

U.S. PATENT DOCUMENTS

| | | |
|---|---|---|
| 4,697,330 | 10/1987 | Paterson et al. . |
| 4,971,924 | 11/1990 | Tigelaar et al. . |
| 5,037,772 | 8/1991 | McDonald . |
| 5,108,941 | 4/1992 | Paterson et al. . |
| 5,130,267 | 7/1992 | Kaya et al. . |
| 5,338,701 | 8/1994 | Hsu et al. . |
| 5,466,629 | 11/1995 | Mihara et al. . |
| 5,506,166 | 4/1996 | Sandhu et al. . |
| 5,554,558 | 9/1996 | Hsu et al. . |
| 5,576,240 | 11/1996 | Radoserich et al. . |

*Primary Examiner*—George Fourson
*Assistant Examiner*—Elizabeth Abbott
*Attorney, Agent, or Firm*—George O. Saile; Stephen B. Ackerman

[57] ABSTRACT

A process is described for the manufacture of a capacitor having low $V_{cc}$. Said process is fully compatible with standard IC manufacturing and introduces minimum modification thereto. The process involves the formation of a capacitor having both upper and lower electrodes that comprise layers of a metal silicide. The lower electrode is formed as a byproduct of the SALICIDE process while the upper electrode is formed by first laying down a layer of polysilicon followed by a layer of a silicide-forming metal such as titanium, cobalt, or tungsten. Sufficient of the metal must be provided to ensure that all of the polysilicon gets transformed to silicide.

20 Claims, 5 Drawing Sheets

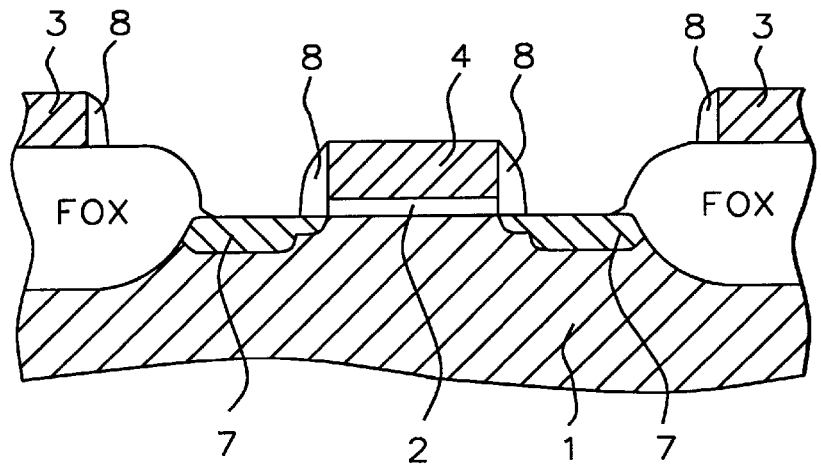
FIG. 1 – Prior Art
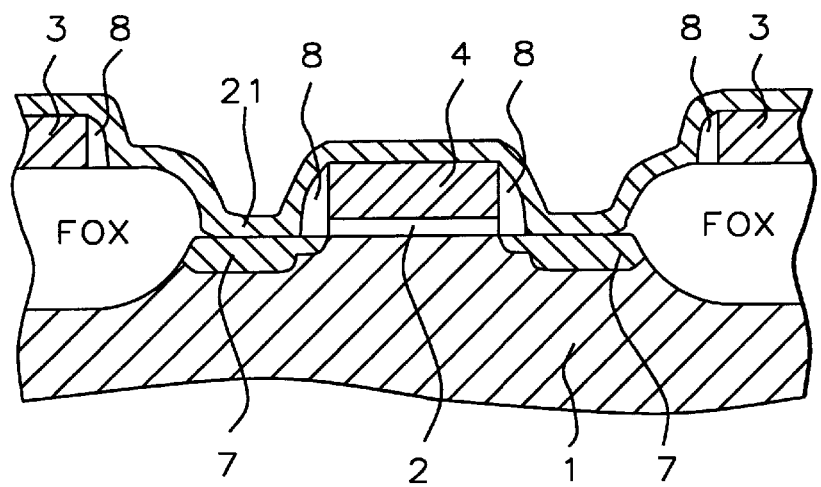
FIG. 2 – Prior Art

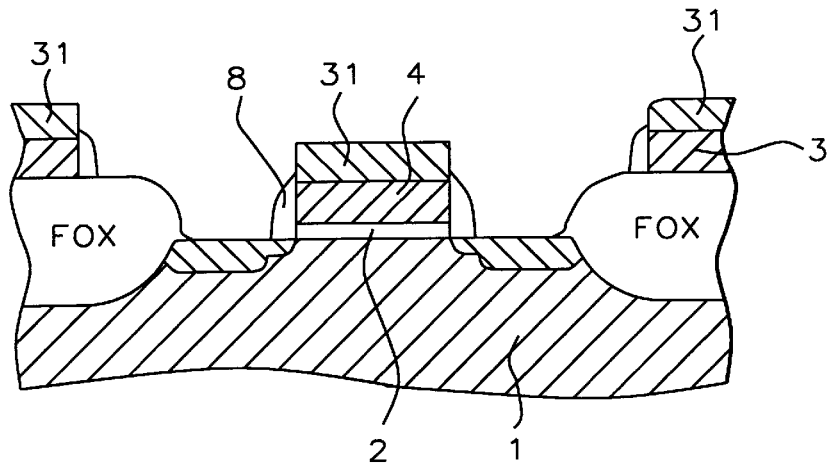
*FIG. 3 – Prior Art*
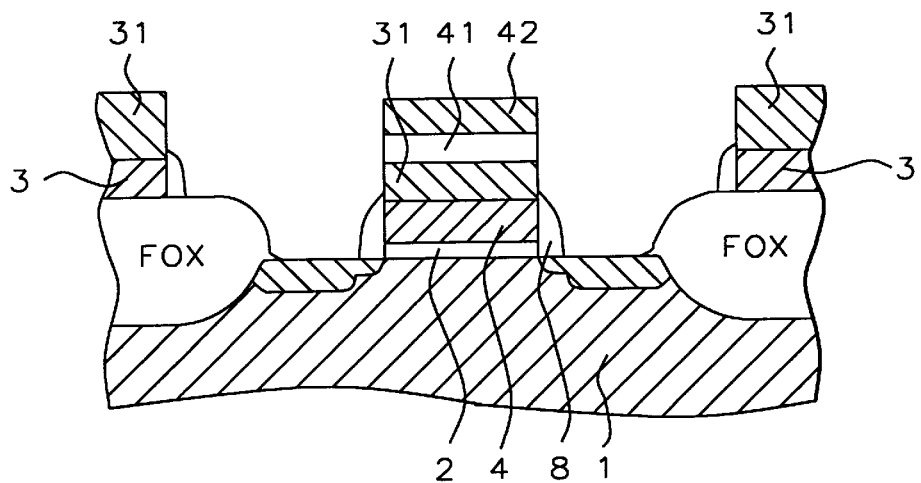
*FIG. 4 – Prior Art*

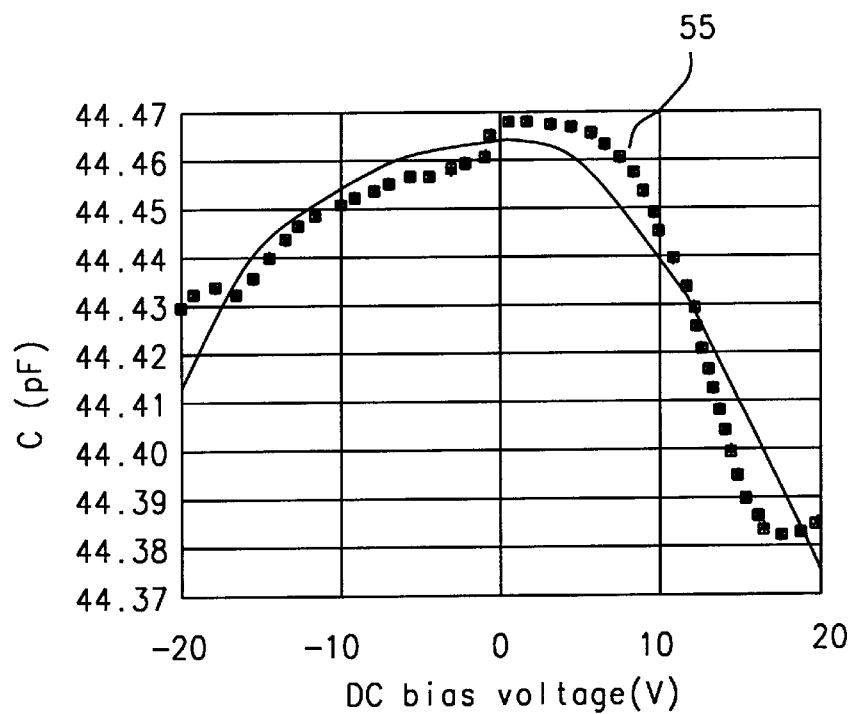
FIG. 5 – Prior Art
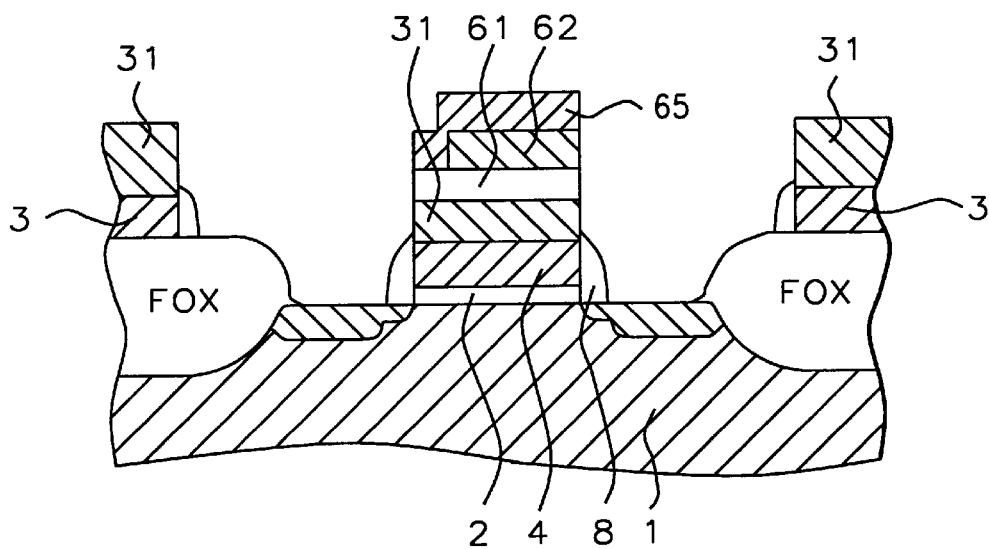
FIG. 6

METHOD FOR MANUFACTURING A SILICIDE TO SILICIDE CAPACITOR

FIELD OF THE INVENTION

The invention relates to the general field of thin film capacitors, with particular reference to their manufacture as part of an overall process for manufacturing integrated circuits.

BACKGROUND OF THE INVENTION

Thin film capacitors are often fabricated as integral parts of integrated circuits. In order to keep cost to a minimum, every attempt is made to form such capacitors using the same (or almost the same) processing steps that would have been used if the circuit had contained no capacitors, changes in the process being thus largely limited to modification of one or two masks.

A typical sequence of events starts, as illustrated schematically in FIG. 1, with silicon substrate 1 having a layer of gate oxide 2 and regions of field oxide (FOX). Polysilicon layer 3 has been deposited onto the layers of gate oxide and field oxide and then patterned and etched, using standard photolithographic techniques to form gate pedestal 4 which is centrally located between two regions of field oxide.

After removing gate oxide that was not covered by the gate pedestal, source and drain regions 7 were formed below the openings in the gate oxide layer. Additionally, insulating spacers 8 were formed on all exposed vertical walls of polysilicon.

This is followed by a self-aligned silicide (SALICIDE) process which enables precise contact to be made to only the polysilicon layers and not to any insulating areas (such as the spacers or the FOX). The SALICIDE process, as illustrated in FIG. 2, begins with the deposition of silicide forming metal layer 21, such as titanium or cobalt. This is then given an RTA (rapid thermal anneal) of between about 25 and 35 seconds at between about 700 and 750° C. (for titianium; for cobalt the temperature would be between about 500 and 550° C.). This causes a rapid reaction between the metal 21 and the polysilicon areas 3 and 4, but not between the metal and the insulating areas 8 or the FOX, where the metal remains in its original, unreacted form. Thus, when a selective etchant, such as a solution of ammonia, nitric acid, and hydrogen peroxide is used, all unreacted metal gets removed and, as shown in FIG. 3, silicide material 31 is left behind only where there had previously been polysilicon (such as at 3 and 4).

A second RTA is normally given at this stage. This is usually at a temperature between about 850 and 900° C. (for titanium; between about 650 and 750° C. for cobalt) for between about 25 and 35 seconds and is for the purpose of bringing about a phase change in the silicide, whereby a different crystal structure is formed that has a significantly lower resistivity than the structure resulting from the intial reaction between the metal and the silicon.

The next step, assuming a capacitor in series with the gate is required, is to deposit a dielectric layer. Typically, in the prior art, silicon oxynitride or PE (plasma enhanced) oxide has been used for this. This is patterned and etched so that it covers only the gate pedestal (plus any other conductive regions set aside for the formation of additional capacitors). It is shown as layer 41 in FIG. 4. Finally, the upper, or counter, electrode for the capacitor must be formed. Since the usual next step, even if no capacitor was being formed, would be the deposition of a layer of polysilicon (so-called second poly) it has been the standard practice to use this same polysilicon layer for the capacitor's upper electrode (shown as 42 in FIG. 4).

While a capacitor structure of the type illustrated in FIG. 4 represents what is probably the cheapest way to incorporate a capacitor within an integrated circuit, capacitors formed in this way do suffer from certain disadvantages. In particular, they tend to have a large $V_{cc}$ (voltage coefficient of capacitance) because a depletion layer (that widens with applied voltage) forms in the polysilicon, causing the capacitance to decrease with applied voltage. This is illustrated in FIG. 5 where curve 55 shows the effects of applied voltage (both positive and negative) on a capacitor of this type (i.e. MiP or metal-insulator-poly, the silicide layer being a metal in terms of its electrical behavior). This is a serious drawback in circuits such A-D and D-A converters, for example.

A number of variations on the above capacitor structure have been described in the prior art. For example, Paterson et al. (U.S. Pat. No. 5,108,941 April 1992) describe a capacitor having a polysilicon lower electrode and a metallic (titanium/tungsten) upper electrode. Radosevitch et al. (U.S. Pat. No. 5,576,240 November 1996) describe a capacitor having a lower electrode of titanium nitride on polysilicon and an upper electrode of aluminum.

Kaya et al. (U.S. Pat. No. 5,130,267 July 1992) disclose a capacitor having a lower electrode of polysilicon and an upper electrode of titanium nitride or titanium tungsten. A feature of the invention is that the top plate is split. Mihara et al. (U.S. Pat. No. 5,466,629) teach a structure having a ferroelectric dielectric and a variety of materials for the end plates.

Sandhu et al. (U.S. Pat. No. 5,506,166 April 1996) show a storage cell capacitor having a lower electrode of titanium silicide while an oxidation resistant conductive material, such as a refractory metal, a conductive metal oxide, or a metal nitride, forms the upper electrode. McDonald (U.S. Pat. No. 5,037,772 August 1991) describes a capacitor having having upper and lower electrodes of polysilicon. The capacitor described by Hsu et al. (U.S. Pat. No. 5,338, 701 August 1994) is a polycide to polysilicon device.

Hsu et al. (U.S. Pat. No. 5,554,558 September 1996) also describe a polycide to polysilicon device while Paterson (U.S. Pat. No. 4,697,330 October 1987) teaches a polysilicon to polysilicon structure. Finally, Tigelaar et al. (U.S. Pat. No. 4,971,924 November 1990) disclose a metal to polysilicon capacitor.

Thus, there does not appear to be any teaching in the prior art concerning the fabrication of a polycide to polycide capacitor, particularly as part of a process for the manufacture of an integrated circuit.

SUMMARY OF THE INVENTION

It has been an object of the present invention to provide a process for manufacturing a capacitor.

A further object of the invention has been that said process be fully compatible with, and require minimum change to, existing processes for the manufacture of integrated circuits.

A still further object has been that said capacitor have a voltage coefficient of capacitance that is lower than 30 ppm/V.

These objects have been achieved by the formation of a capacitor having both upper and lower electrodes that comprise layers of a metal silicide. The lower electrode is formed as a byproduct of the SALICIDE process while the upper electrode is formed by first laying down a layer of polysilicon followed by a layer of a silicide-forming metal such as titanium, cobalt, or tungsten. Sufficient of the metal must be provided to ensure that all of the polysilicon gets transformed to silicide.

BRIEF DESCRIPTION OF THE DRAWINGS

FIG. 1 is a schematic cross-section of a portion of an integrated circuit at a stage in its manufacture.

FIGS. 2–4 show the formation of a capacitor in the circuit of FIG. 1, according to the practices of the prior art.

FIG. 5 is a plot of capacitance vs. voltage of a capacitor formed according to the process illustrated in FIGS. 1–4.

FIGS. 6 and 7 show the formation of a capacitor in the circuit of FIG. 1, according to the practices of the present invention.

DESCRIPTION OF THE PREFERRED EMBODIMENTS

Figure 7:
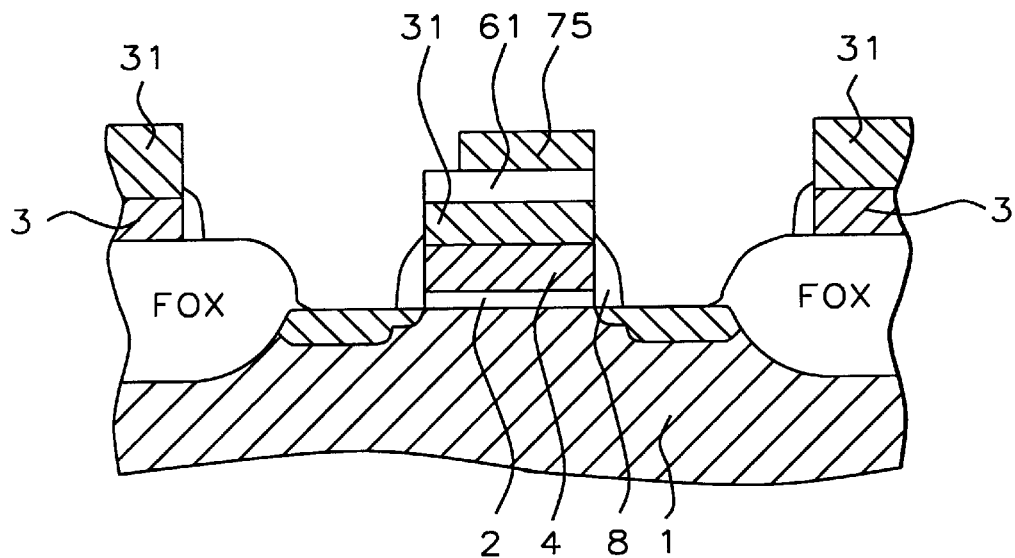

The process of the present invention will be described within the context of the manufacture of a silicon integrated circuit. It will, however, be understood that said process does not require an integrated circuit and would work just as well if it were exercised as a stand alone process.

We will begin our description of the process of the present invention by referring to certain initial steps that are known in the prior art. Thus we refer once more to FIG. 1 where silicon substrate 1 having a layer of gate oxide 2 and regions of field oxide (FOX) is shown. Polysilicon layer 3 is then deposited (to a thickness between about 1,800 and 2,200 Angstroms) onto the layers of gate oxide and field oxide following which it is patterned and etched, using standard photolithographic techniques, to form gate pedestal 4 which is centrally located between two regions of field oxide.

After removing gate oxide that was not covered by the gate pedestal, source and drain regions 7 are formed below the openings in the gate oxide layer. Additionally, insulating spacers 8 are formed on all exposed vertical walls of polysilicon.

Referring now to FIG. 2, the next step is the deposition of silicide forming metal layer 21, such as titanium or cobalt, to a thickness between about 275 and 300 Angstroms. This is then given an RTA of between about 25 and 35 seconds at between about 700 and 750° C. Next, a selective etchant, such as a solution of ammonia, nitric acid, and hydrogen peroxide, is used to remove all unreacted metal. The result is shown in FIG. 3, silicide material 31 is left behind only where there had previously been polysilicon (such as at 3 and 4). A second RTA is now given at a temperature between about 850 and 950° C. for between about 25 and 35 seconds in order to lower the resistivity silicide layer 31.

Referring now to FIG. 6, dielectric layer 61 is now deposited. Our preferred choice of material for the dielectric layer has been oxynitride or PE oxide but materials such as tantalum oxide, barium titanate or strontium titanate could also have been used. It is deposited using plasma enhanced chemical vapor deposition (PECVD) at a temperature between about 350 and 400° C., which is somewhat lower than the deposition temperatures described for capacitor dielectrics in the prior art. Its thickness is between about 300 and 400 Angstroms. Dielectric layer 61 is patterned and etched so that it covers only the gate pedestal 4 (plus any other conductive regions set aside for additional capacitors). Finally, the upper, or counter, electrode for the capacitor must be formed. This is done in two steps and is a key feature of the invention.

The first step is to deposit polysilicon layer 62 (to a thickness between about 500 and 700 Angstroms) which is then patterned and etched to form upper electrode 62. A small area of dielectric layer 61 is left uncovered to facilitate later connection to lower electrode 31. Then, another layer of a silicide forming metal 65 (such as titanium, cobalt, tungsten, nickel or molybdenum) is deposited onto upper electrode 62 to a thickness between about 275 and 400 Angstroms. It is important that this thickness of layer 65 be sufficient to ensure that all of layer 62 gets transformed to the silicide during the RTA that follows the deposition of 65.

Said RTA is for between about 25 and 35 seconds at between about 680 and 725° C. which is sufficient for all 62 to react and become silicide layer 75, as shown in FIG. 7. Any unreacted metal (former layer 65) is now removed by selective etching. As in the conventional SALICIDE process, this means automatic removal of all areas where a layer of polysilicon was not already in place, so no unintended stringers of metal remain to cause unintended shorting.

The system is now given an RTA at between about 850 and 900° C. for between about 25 and 35 seconds. This results in significant densification of dielectric layer 61. As discussed above, layer 61 was laid down at a lower temperature than is customary in the prior art and this makes the densifying step advisable.

Figure 8:
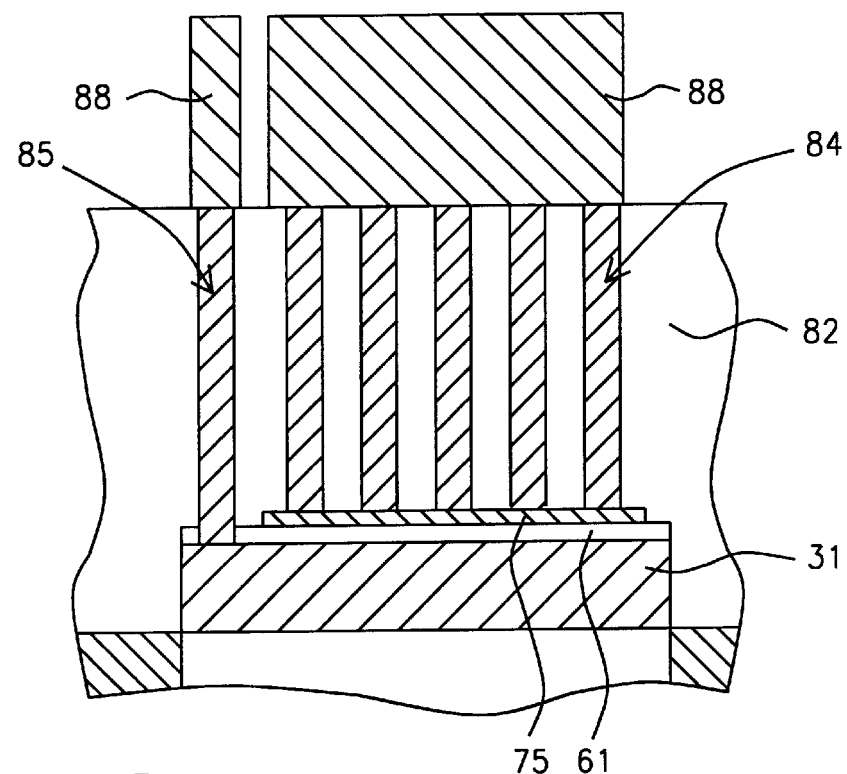
FIG. 8 illustrates a later stage in the manufacturing cycle of the circuit seen in FIG. 7.

Although the main features of the invention have now been disclosed, it is worth noting that, to continue the manufacture of the integrated circuit, the next step would be the deposition of an inter layer dielectric (ILD) layer. This is shown as layer 82 in FIG. 8. After the top surface of 82 has been planarized, contact holes, such as 84 that extend through 82 as far as upper silicide electrode 75, and 85 that extend through both 82 and 61 as far as lower silicide electrode 31, are formed and then filled with a metal such as tungsten. This is followed by the deposition of metal layer 88 which is patterned and etched to provide interconnecting wiring to other parts of the integrated circuit.

Figure 9:
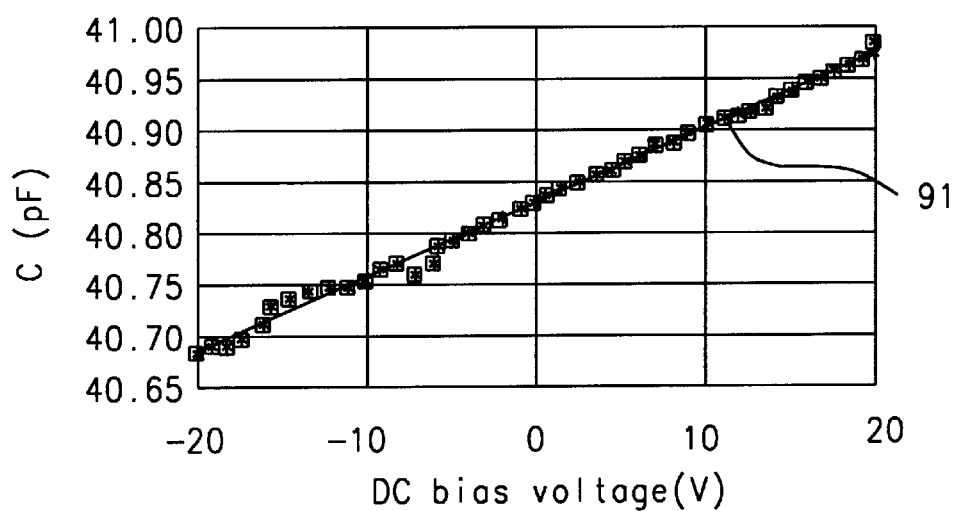
FIG. 9 is a plot of capacitance vs. voltage of a capacitor formed according to the process of the present invention.

The improvement in $V_{cc}$ that results from the use of the electrode system disclosed in the present invention is apparent from the data summarised by curve 91 in FIG. 9, plotting capacitance as a function of applied voltage from –20 to +20 volts.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a capacitor, comprising the sequential steps of:

providing a first layer of polysilicon on a dielectric substrate;

patterning the first layer of polysilicon to form a lower electrode;

depositing a first layer of a silicide forming metal onto said lower electrode;

subjecting said first metal and lower electrode to a first rapid thermal anneal whereby the metal and the polysilicon react to form a first silicide;

removing all unreacted portions of the metal layer, resulting in a first structure;

subjecting the first structure to a second rapid thermal anneal whereby the resistivity of the silicide is reduced;

depositing a dielectric layer;

patterning and etching said dielectric layer whereby it covers only the lower electrode;

depositing a second polysilicon layer;

patterning and etching the second polysilicon layer to form an upper electrode;

depositing a second layer of a silicide forming metal onto said upper electrode, resulting in a second structure;

subjecting said second structure to a third rapid thermal anneal whereby the second metal and all of the second polysilicon react to form a second silicide layer;

removing all unreacted portions of the second metal layer, resulting in a third structure; and subjecting the third structure to a fourth rapid thermal anneal whereby the density of the dielectric layer is increased.

2. The process of claim 1 wherein the dielectric layer is selected from the group consisting of oxynitride, PE oxide, tantalum oxide, barium titanate and strontium titanate.

3. The process of claim 1 wherein the step of depositing a dielectric layer further comprises plasma enhanced chemical vapor deposition.

4. The process of claim 1 wherein the dielectric layer is deposited to a thickness between about 250 and 400 Angstroms.

5. The process of claim 1 wherein the second polysilicon layer is deposited to a thickness between about 550 and 700 Angstroms.

6. The process of claim 1 wherein the second silicide forming metal is selected from the group consisting of titanium, cobalt, tungsten, nickel and molybdenum and is deposited to a thickness between about 275 and 400 Angstroms.

7. The process of claim 1 wherein the step of subjecting said second structure to a third rapid thermal anneal further comprises heating at a temperature between about 700 and 750° C. for between about 25 and 35 seconds.

8. The process of claim 1 wherein the step of subjecting the third structure to a fourth rapid thermal anneal further comprises heating at a temperature between about 850 and 900° C. for between about 25 and 35 seconds.

9. A process for manufacturing a capacitor within an integrated circuit, comprising the sequential steps of:

providing a silicon substrate having a layer of gate oxide and regions of field oxide;

depositing a first layer of polysilicon onto the layers of gate oxide and field oxide;

patterning and etching the first layer of polysilicon to form a gate pedestal centrally located between two regions of field oxide;

removing gate oxide not covered by the gate pedestal and then forming source and drain regions between the field oxide and the gate pedestal;

depositing a first layer of a silicide forming metal;

subjecting the integrated circuit to a first rapid thermal anneal whereby the metal and the polysilicon react to form a first silicide;

removing all unreacted portions of the metal layer;

subjecting the integrated circuit to a second rapid thermal anneal whereby the resistivity of the silicide is reduced;

depositing a dielectric layer;

patterning and etching said dielectric layer whereby it covers only the gate pedestal;

depositing a second polysilicon layer;

patterning and etching the second polysilicon layer to form an upper electrode;

depositing a second layer of a silicide forming metal onto said upper electrode;

subjecting the integrated circuit to a third rapid thermal anneal, whereby the second metal and all of the second polysilicon react thereby transforming said second polysilicon layer into a second silicide layer;

removing all unreacted portions of the second metal layer;

subjecting the integrated circuit to a fourth rapid thermal anneal whereby the density of the dielectric layer is increased;

depositing an ILD layer;

forming contact holes that extend through said ILD layer to the first and second silicide layers; filling the contact holes with tungsten; and depositing a third layer of metal onto the ILD layer.

10. The process of claim 9 wherein the first polysilicon layer is deposited to a thickness between about 1,800 and 2,000 Angstroms.

11. The process of claim 9 wherein the first layer of a silicide forming metal is selected from the group consisting of titanium, cobalt, tungsten, nickel and molybdenum.

12. The process of claim 9 wherein the first silicide forming metal is deposited to a thickness between about 250 and 300 Angstroms.

13. The process of claim 9 wherein the dielectric layer is selected from the group consisting of oxynitride and PE oxide.

14. The process of claim 9 wherein the step of depositing a dielectric layer further comprises plasma enhanced chemical vapor deposition.

15. The process of claim 9 wherein the dielectric layer is deposited to a thickness between about 250 and 400 Angstroms.

16. The process of claim 9 wherein the second polysilicon layer is deposited to a thickness between about 275 and 400 Angstroms.

17. The process of claim 9 wherein the second silicide forming metal is selected from the group consisting of titanium, cobalt, tungsten, nickel, and molybdenum.

18. The process of claim 9 wherein the second silicide forming metal is deposited to a thickness between about 275 and 400 Angstroms.

19. The process of claim 9 wherein the step of subjecting the integrated circuit to a third rapid thermal anneal further comprises heating at a temperature between about 700 and 750° C. for between about 25 and 35 seconds.

20. The process of claim 9 wherein the step of subjecting the integrated circuit to a fourth rapid thermal anneal further comprises heating at a temperature between about 850 and 900° C. for between about 25 and 35 seconds.

* * * * *